(12) United States Patent  
Ohtaki et al.

(10) Patent No.: US 8,809,782 B2
(45) Date of Patent: Aug. 19, 2014

(54) SCANNING ELECTRON MICROSCOPE

(75) Inventors: Tomohisa Ohtaki, Hitachinaka (JP); Masahiko Ajima, Hitachinaka (JP); Sukehiro Ito, Hitachinaka (JP); Mitsuru Onuma, Tokyo (JP); Akira Omachi, Komae (JP)

(73) Assignee: Hitachi High-Technologies Corporation, Tokyo (JP)

(*) Notice: Subject to any disclaimer, the term of this patent is extended or adjusted under 35 U.S.C. 154(b) by 439 days.

(21) Appl. No.: 13/387,424

(22) PCT Filed: Jul. 20, 2010

(86) PCT No.: PCT/JP2010/004636
§ 371 (c)(1),
(2), (4) Date: Jan. 27, 2012

(87) PCT Pub. No.: WO2011/013323
PCT Pub. Date: Feb. 3, 2011

(65) Prior Publication Data
US 2012/0127299 A1    May 24, 2012

(30) Foreign Application Priority Data

Jul. 30, 2009 (JP) .................... 2009-177196

(51) Int. Cl.
*H01J 37/00* (2006.01)
*H01J 37/16* (2006.01)
*F16F 15/04* (2006.01)
*H01J 37/28* (2006.01)

(52) U.S. Cl.
CPC ............ *H01J 37/28* (2013.01); *H01J 37/16* (2013.01); *F16F 15/04* (2013.01); *H01J 2237/0216* (2013.01)
USPC ............ 250/310; 250/306; 250/307; 250/311

(58) Field of Classification Search
CPC  H01J 37/20; H01J 2237/0216; H01J 2237/20
USPC .................... 250/306, 307, 310, 311
See application file for complete search history.

(56) References Cited

U.S. PATENT DOCUMENTS 5,559,329 A * 9/1996 Joseph et al. ............ 850/9

FOREIGN PATENT DOCUMENTS

| JP | U 61-079450 A | 5/1986 |
| JP | 2005-077498 | 3/2005 |
| JP | 2006-079870 | 3/2006 |

* cited by examiner

*Primary Examiner* — Michael Maskell
(74) *Attorney, Agent, or Firm* — Antonelli, Terry, Stout & Kraus, LLP.

(57) ABSTRACT

A scanning electron microscope includes a main scanning electron microscope unit having an electron optical column and a sample chamber, a controller over the main scanning electron microscope unit, a single housing that houses both the main scanning electron microscope unit and the controller, and a bottom plate disposed under the single housing, the main scanning electron microscope unit and the controller. A first leg member is attached to a bottom face of the bottom plate on a side of the controller with a first opening hole provided through the bottom plate on a side of the main scanning electron microscope unit, and a damper is fixed to a bottom face of the main scanning electron microscope unit and disposed through the first opening hole.

14 Claims, 8 Drawing Sheets

SCANNING ELECTRON MICROSCOPE

FIELD OF THE INVENTION

The present invention relates to a vibration control technology for scanning electron microscopes and especially for scanning electron microscopes of a desktop type.

DESCRIPTION OF RELATED ART

The scanning electron microscope (SEM), which has been known to be able to obtain a high magnification image on an object, is able to have an electron beam converge on the object, scan the electron beam on the object, detect electrons emitted from the object and display a scanning electron image of the object on an image display device. The scanning electron microscope needs several tens times as high a voltage as 1 kilo-volt to be able to generate an electron beam. Moreover the scanning electron microscope needs to have an internal atmosphere that is kept vacuumed to stabilize the generated electron beam. Accordingly the scanning electron microscope is equipped with a high voltage generating device, a vacuum pump and needs to have a pressure-proof structure and tends to become usually a large apparatus and sometimes so large as to be installed in a dedicated room. Therefore the scanning electron microscope is generally a large sized one to be installed in a clean room or measurement room. Furthermore the scanning electron microscope needs to have a structure whose vibration is well controlled to prevent an observed image of the object from being deteriorated.

A pressure-proof structure of the conventional scanning electron microscope is shown in FIG. 2. The shown scanning electron microscope is usually a very large sized apparatus and has a main scanning electron microscope unit, a control device to control the main scanning electron microscope unit and a monitor to display observed images, each of which is installed on a separate mount. In the case of the structure shown in FIG. 2, a main scanning electron microscope unit 205, which includes such devices as an electron beam gun 201, a lens unit 203, a sample chamber 202 and a sample stage 204, is secured to a load plate 206 and a whole apparatus inclusive of these devices and the load plate 206 is installed on dampers 207 disposed on a first mount. Due to this structure, a vibration is not easily transmitted from the floor to the main scanning electron microscope unit 205.

A main pump 209 to vacuum an inside of the main scanning electron microscope unit is connected to a lower portion of the sample chamber 202 and vacuums an inside of the sample chamber 202. An evacuation passage from the main pump 209 is connected through a pipe 210 to the electron beam gun 201 to vacuum an inside of the electron beam gun as well as an inside of the lens unit 203. A vibration control damper 211 is installed between the main pump 209 and the sample chamber 202. With this structure, transmission of a vibration generated in the main pump is reduced. The patent document 1 discloses a structure of this type.

The monitor 212 on which observed images are displayed is supported on a second mount 213. Inside the second mount 213 are housed a control section 214 for such devices as the main scanning electron microscope unit 205 and a computer 215 to perform an image processing on observed images displayed on the monitor 212. Cooling fans are usually attached to the control section and the computer 215 and are vibration sources for the main scanning electron microscope unit 205. Having the main pump 209 to be a vibration source supported on a mount and the control section 214 and the computer to be another vibration source supported on another mount, the vibration to be transmitted to the main scanning electron microscope unit 205 is reduced. As a result, clear observed images without noises attributed to the vibrations are obtained.

Recently such a small sized scanning electron microscope apparatus as to be installed and used on a table or a working table has been promoted, as technologies for the small sized scanning electron microscope have been developed. Since a scanning electron microscope of this small sized type is installed on a table, the control section for the main scanning electron microscope unit to be a vibration source and the vacuum pump to be another vibration source have to be supported on a single mount and usually can not be supported separately on mounts apart from each other. In FIG. 3 is shown a structure example for a desktop type scanning electron microscope in which both the control section for the main scanning electron microscope unit and the vacuum pump are simply installed in a single housing. The main scanning electron microscope unit 305 comprises an electron beam gun 301, a lens unit 303, a sample chamber 302 and a sample stage 304. The main scanning electron microscope unit 305 is secured to a bottom plate 312 that supports a whole apparatus and vibration control dampers 313 are attached between the main scanning electron microscope unit 305 and the bottom plate 312. The bottom plate 312 is supported by leg members 317. A main pump 309 to vacuum an inside of the main scanning electron microscope unit is connected to an upper portion of the lens unit 303 and a vibration control damper is attached between the main pump 309 and the lens unit 303. A control unit 315 inclusive of a power supply and circuit boards is mounted on the bottom plate 312 that supports the whole apparatus. In the control unit 315 is installed such a devise as a cooling fan. The scanning electron microscope unit inclusive of all of the electron beam gun 301, the lens unit 303, the sample chamber 302 and the sample stage 304 and the control unit are covered with a cover 316.

As has been explained, if all the units that constitute a scanning electron microscope of a conventional type are installed in a single housing, a vibration generated on the floor and a vibration generated by the pump are absorbed usually by dampers.

PRIOR ART DOCUMENT

Patent Document

Patent Document 1: Japanese Unexamined Utility Model Publication S61-079450

SUMMARY OF THE INVENTION

Objective to be achieved by the Present Invention

Since the scanning electron microscope as shown in FIG. 3 has the control unit 315 fixed to the bottom plate 312, a vibration that is generated by the cooling fan and can not be controlled by the dampers 313 is transmitted to the main scanning electron microscope unit. As a result, the observed images can be adversely affected by the transmitted vibration.

The objective of the present invention is to bring into reality a desktop type scanning electron microscope in which a control unit inclusive of a main scanning electron microscope unit, an evacuation unit, a power supply and a cooling fan is installed on a single bottom plate and whose vibration reduction function is better than the scanning electron microscope of the conventional desktop type.

Measure to Achieve the Objective

According to an aspect of the technical scope of the present invention, a damper to support a main scanning electron microscope unit is extended toward an installation plane and further below the bottom plate which supports the main scanning electron microscope unit and a control unit. To be more specific, an opening hole is bored through the bottom plate and the damper is extended through the opening hole and further below the opening hole. As a result, the vibration absorbing property of the scanning electron microscope of the present invention becomes higher than that of the conventional one. The damper may be made in direct contact with an installation plane or in contact with some support members disposed on the installation plane.

Effect of the Present Invention

Since a length of the damper of the scanning electron microscope of the present invention is made longer, a natural frequency of the main scanning electron microscope unit is lowered if the size (especially height) of the main scanning electron microscope unit is unchanged from that of the conventional scanning electron microscope. Accordingly a vibration free frequency band becomes wider than the conventional one and the vibration reduction property becomes better than the conventional one.

DETAILED DESCRIPTION OF THE EMBODIMENTS

Hereinafter are explained embodiments.
First Embodiment
An explanation is given on a structure of a desktop type scanning electron microscope in which a damper is in direct contact with a floor surface through an opening hole bored through the bottom plate.

Figure 4:
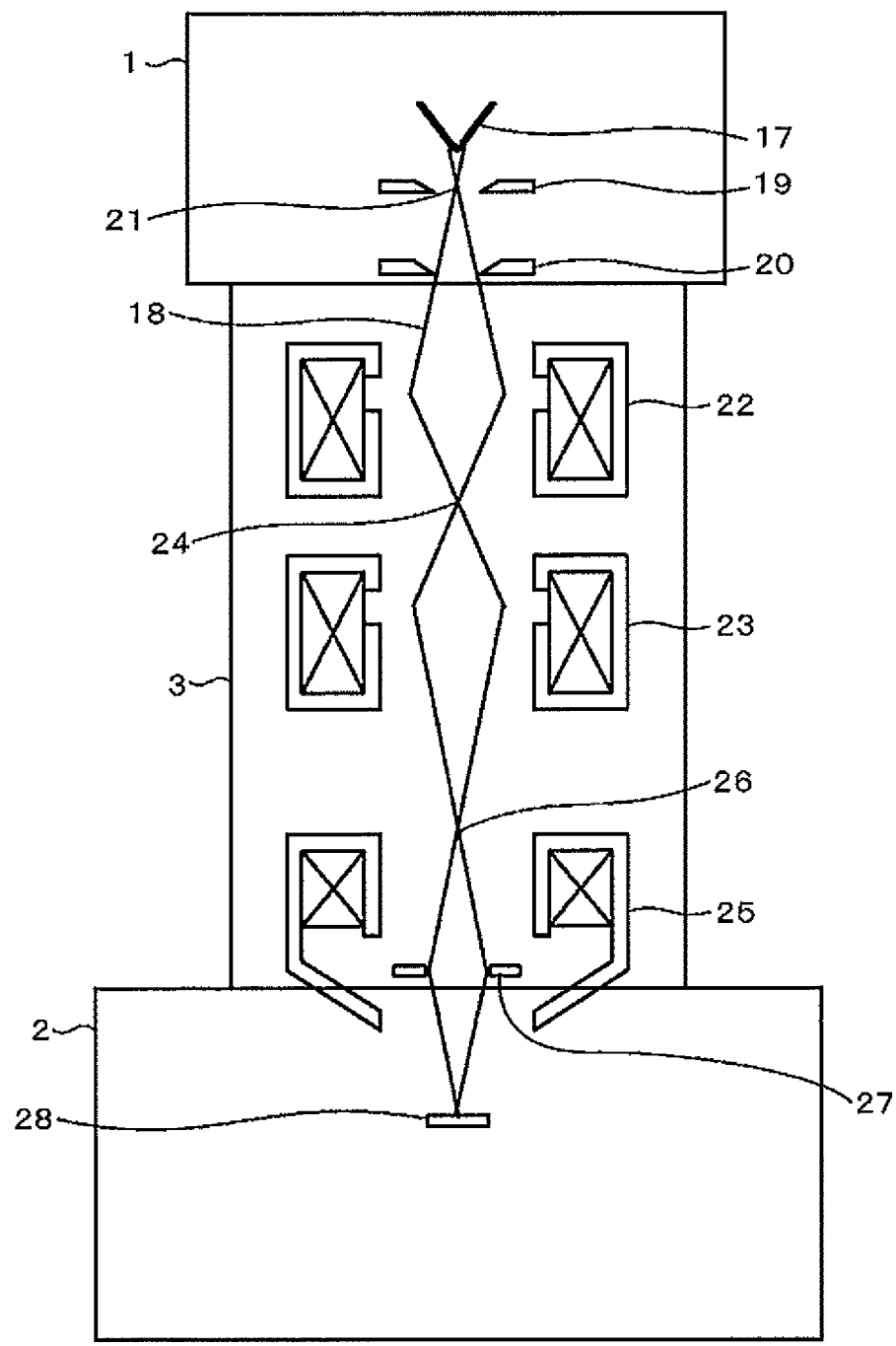
FIG. 4 shows an internal structure of an electron optical column of a scanning electron microscope for the first embodiment.

Firstly a structure of an electron scanning microscope is explained with reference to FIG. 4. A main scanning electron microscope unit for the present embodiment is constituted by such devices as an electron beam gun 1, a lens unit 3 as a sample chamber 2. As is not shown in FIG. 4, a sample stage is installed inside the sample chamber 2. When the apparatus is being used, an inside of the apparatus is vacuumed to a vacuum level higher than or equal to a predetermined vacuum level. When a high voltage is applied to an electron source 17, an electron beam 18 is emitted. Since the emitted electron beam 18 undergoes a convergence action from a potential of a wehnelt electrode 19, the emitted electron beam 18 propagates along on a curved trajectory and a first crossover 21 is formed between the wehnelt electrode 19 and an anode 20. The electron beam 18 passes through the anode 20 while being accelerated by a voltage difference between the wehnelt electrode 19 and the anode 20 (acceleration voltage) and undergoes a convergence action from a first condenser lens 22. As a result, a second crossover 24 is formed between the first condenser lens 22 and a second condenser lens 23. The electron beam 18 undergoes a convergence action from the second condenser lens 23 after passing a position for the second crossover 24 and a third crossover 26 is formed between the second condenser lens and an objective lens 25. Since the electron beam 18 widened up to a predetermined size is allowed to pass through an objective lens aperture 27 after the electron beam 18 passes a position on the third crossover 26, only a part of the electron beam 18 comes incident on the objective lens 25. The electron beam 18 coming incident on the objective lens 25 converges on and radiates to a surface of the sample stage 28. On the electron beam 18 radiating onto a surface of a sample, backscattered electrons flying from on the surface of the sample are generated of the electron beam 18 radiating to the sample surface and secondary electrons flying from on the surface of the sample are generated of the surface of the sample. A detector, which is not shown, is installed in the sample chamber 2 and has a function of detecting the backscattered electrons and the secondary electrons and outputting detection signals. An image signal is made of the detection signal after transmitted to an amplification circuit and an AD conversion circuit and is further transmitted to a monitor, where an image of the image signal is displayed. The quality of the displayed image is influenced by such factors as the vibration of the apparatus, noises and stains.

Figure 1:
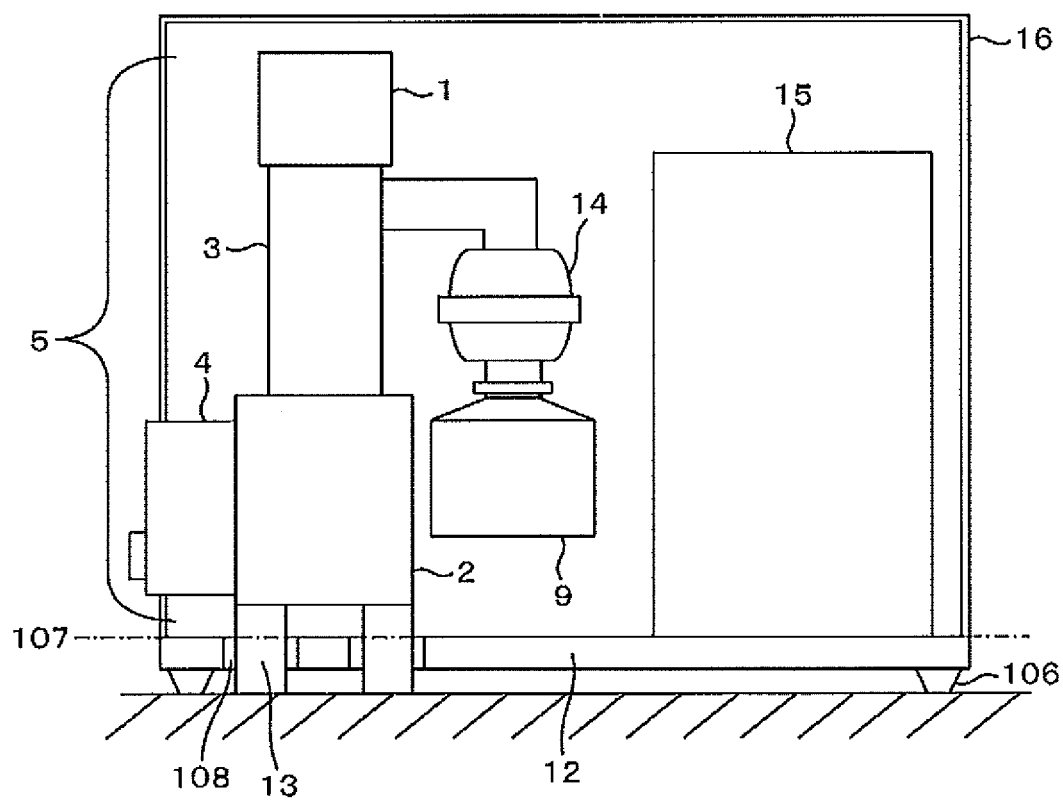
FIG. 1 shows a vibration reduction structure of a scanning electron microscope for the first embodiment.

FIG. 1 is a cross sectional view for an entire structure of the present embodiment. This desktop type scanning electron microscope of the present embodiment comprises a main scanning electron microscope unit 5 which is inclusive of an electron beam gun 1, a lens unit 3, a sample chamber 2 and a sample stage 4 and is installed on support members having a vibration absorbing property and disposed on a floor on which the apparatus is installed. The main scanning electron microscope unit 5 is not installed on a bottom plate 12 which supports the entire apparatus. To enable this structure, the bottom plate 12 has opening holes 108 through each of which a damper 13 is disposed on the floor surface. As is not seen in FIG. 1, there are four dampers 13 attached on four corner portions of sample chamber 2 and the main scanning electron microscope unit 5 is supported on the 4 points on an installation plane. The bottom plate 12 is supported by leg members 106 on the installation plane.

A main pump 18 to evacuate and vacuum the inside of the main scanning electron microscope unit 5 is connected to an upper portion of the lens unit 3 through a damper 14 to absorb vibrations. On the bottom plate 12 are installed a control unit 15 inclusive of a power supply for the main scanning electron microscope unit 5 and the main pump 9, a control circuit board and a cooling fan. The cooling fan is indispensable for cooling the control unit 15 inclusive of the power supply and the circuit board and the main pump 9. The main scanning electron microscope unit 5 inclusive of the electron beam gun 1, the lens unit 3, the sample chamber 2 and the sample stage 4 and the control unit 15 are covered with a cover 16. The cover 16 is supported by the bottom plate 12 and disposed not to be in contact with the main scanning electron microscope unit 5.

Figure 3:
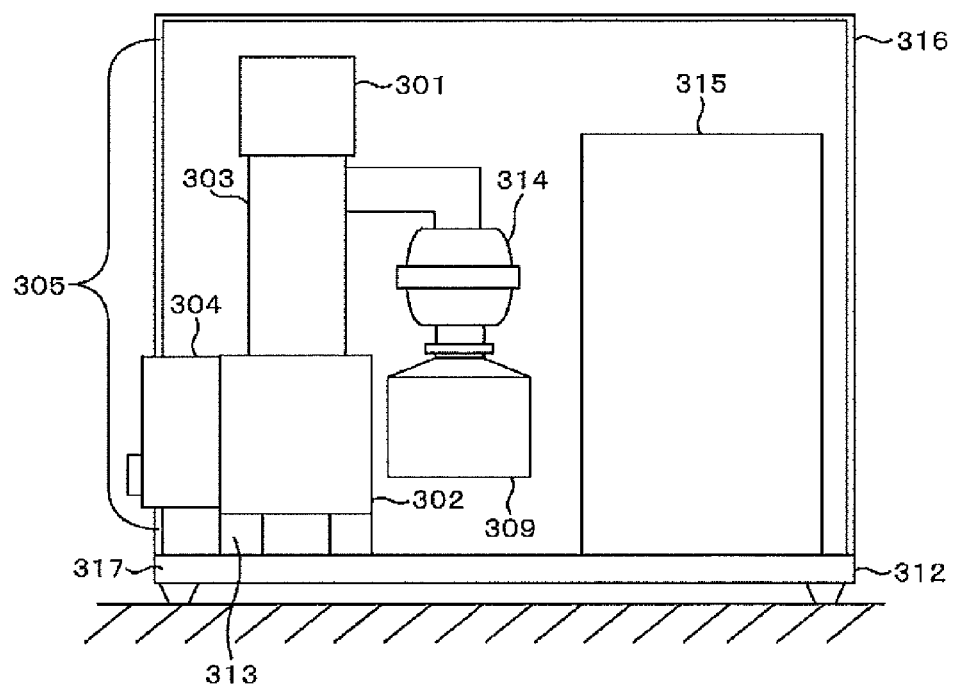
FIG. 3 shows a structure of a conventional desktop type scanning electron microscope.

In the conventional structure shown in FIG. 3, there is no opening hole corresponding to the opening hole 10B of the present embodiment and all dampers 13 are disposed on the bottom plate 12. Accordingly the length of the damper 13 is allowed to be made a length from the bottom surface of the sample chamber 2 to the upper face 107 (indicated by a single dashed line) of the bottom plate 12 at the largest in the conventional structure. On the other hand, since the damper 13 is allowed to extend lower than the upper face 107 toward the installation plane in the present embodiment, it is possible to lower the natural vibration frequency of the damper. As a result, the vibration free frequency band is widened.

Another structural feature of the present embodiment is that vibrations generated inside the apparatus are isolated from the damper 13 because the main scanning electron microscope unit 5 is separated from the bottom plate 12 and supported directly by the installation surface. Main vibration sources in the apparatus are the main pump 9 and the cooling fan installed in the control unit 15. It is difficult to separate the main pump 9 from the main scanning electron microscope unit 5 as the inside of the main scanning electron microscope unit 5 has to be vacuumed. However, the control unit 15 is allowed to be separated from the main scanning electron microscope unit 5 except for its electrical wire lines.

Figure 2:
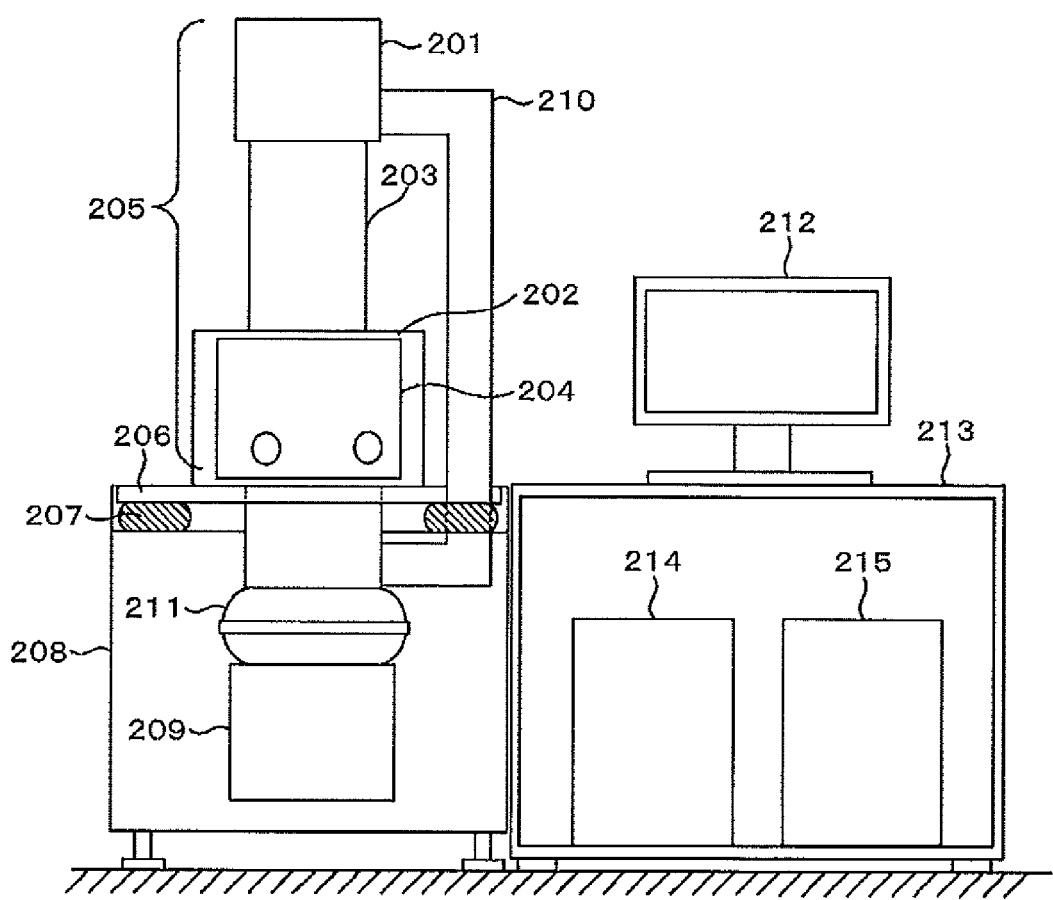
FIG. 2 shows a structure of a conventional scanning electron microscope.

The control unit 15 that is one of the vibration sources is possibly made to be a completely separate unit from the main scanning electron microscope unit 5 as is shown in FIG. 2. However, in the case of the desktop type scanning electron microscope in which the apparatus is required to be made relatively small, the main scanning electron microscope unit 5 and the control unit 15 are required to be housed together in a single housing. Accordingly the structure of the present embodiment works out for the desktop type scanning electron microscope.

Second Embodiment

In the case of the structure shown in FIG. 1, the vibration reduction property is improved over the conventional structure because the control unit 15 to be a vibration source is separated from the bottom plate 12. However, since the main scanning electron microscope unit 5 is not connected with the bottom plate 12 at all, the main scanning electron microscope unit 5 can not follow the other parts of the total apparatus that are moving and forced to be dragged when the total apparatus is being moved. In case there is some impact applied to the apparatus, the main scanning electron microscope unit 5 as well as the damper could leap up onto the bottom plate 12. In the present embodiment, a following mechanism to have the main scanning electron microscope unit follow the bottom plate moving is additionally attached to get rid of the above mentioned risk. Hereinafter a structure inclusive of this following mechanism is to be explained.

Figure 5:
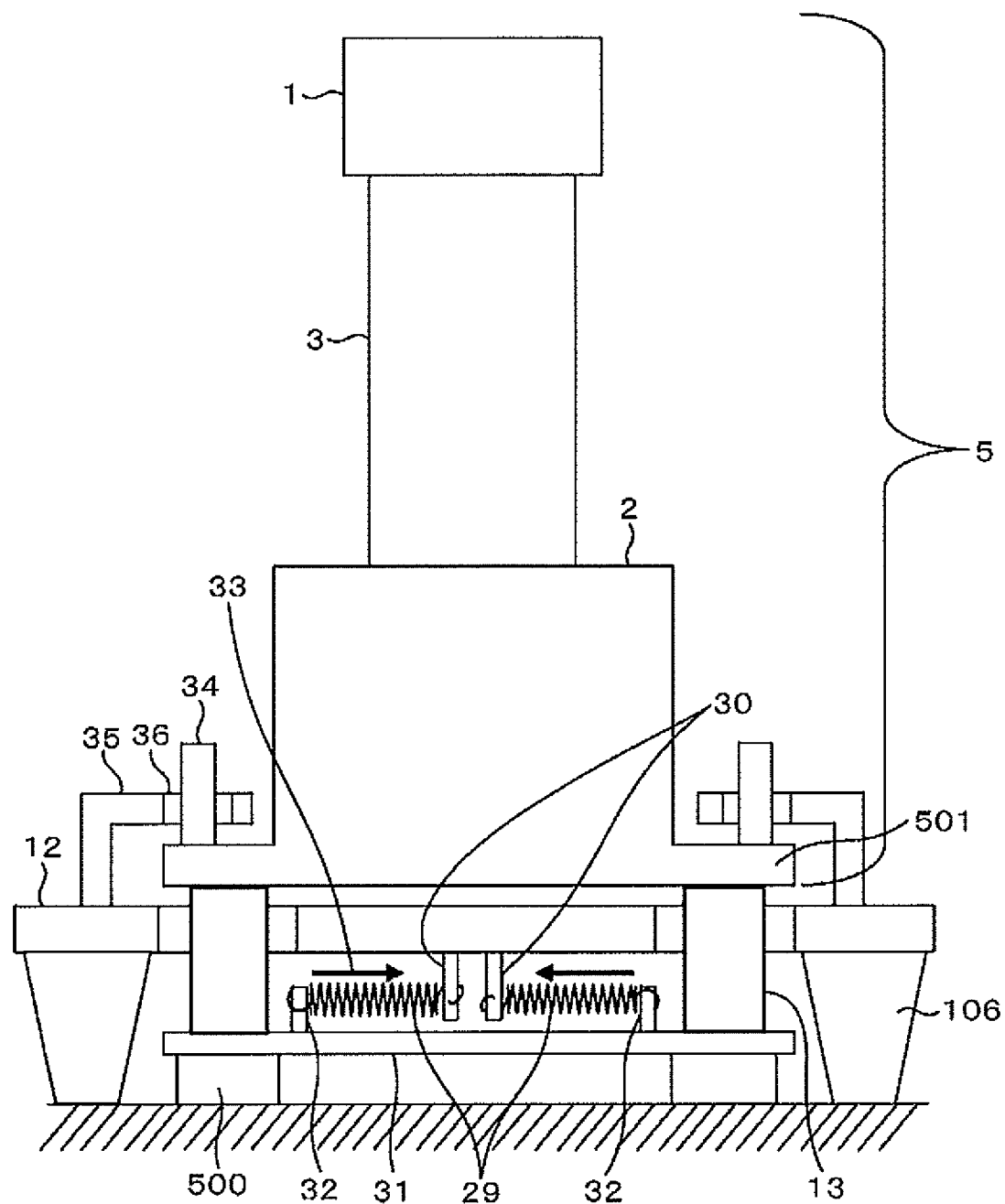
FIG. 5 shows a modified vibration structure of a scanning electron microscope of the first embodiment.

FIG. 5 is an elevation view for a scanning electron microscope of the present embodiment that is viewed from its sample chamber side (a housing skipped and not shown). To have an explanation easily understood, main structural elements are described with their sizes exaggerated and as it is, each structural element is more or less as large as that described in the scanning electron microscope in FIG. 1.

The following mechanism of the present embodiment has a feature of generating a tension force with a spring exerted for following. Looking at the structure in FIG. 5, it is seen that each of dampers 13 is divided in two parts and that a plate member 31 is disposed inbetween. Accordingly the plate member 31 is disposed under and apart from a bottom plate 12. Instead of dividing each damper, a structure of having the dampers disposed on the upper surface of the plate member 31 and second leg members 500 disposed on the lower surface of the plate member 31 may be used. Since the second leg member 500 is capable of being made to slide smoothly on the floor, the second leg member 500 is made preferably of such a material having a low friction coefficient as a fluorinated carbon resin like fluorinated-poly-tetra-ethylene or Derlin (registered trademark).

Springs 29 are disposed in a space between the bottom plate 12 and the plate member 31. A pin 32 to fix one end of each of the springs 29 is secured to the plate member 31. Moreover the other end of each of the springs 29 is fixed to a pin 30 secured to a bottom surface of the bottom plate 12. With these springs in place, a tension force is generated between the bottom plate 12 and the damper 13 supporting the main scanning electron microscope unit 5 and the main scanning electron microscope unit 5 is capable of following the bottom plate 12 that is moving. It should be understood that the pins 30, the pins 32 and the springs 29 are disposed in such a way that a balanced position about which the generated tension forces are balanced comes to a center or a gravitational center of the sample chamber 2. Because the springs 29 are kept balanced, each of the dampers 29 is centered in the opening hole 108 and kept off from the bottom plate 12. As a result, the vibration on the bottom plate is prevented from being transmitted.

Though FIG. 5 shows the following mechanism in the left-right direction on the page, it should be understood that there are pins and springs disposed in the vertical direction to the page to generate a tension force in the vertical direction for the following mechanism. Accordingly tension forces are generated both in the X and Y direction, which enable the scanning electron microscope to move while following the apparatus.

In order to prevent the main scanning electron microscope unit 5 from running up onto the bottom plate 12, a flange 501 is formed on the lower side of the sample chamber 2 and a pin 34 is further attached on the flange 501. At the same time a chassis 35 is attached on the bottom plate 12 to have the upper face of the chassis 35 face the flange 501. There is a hole 36 in the chassis 35 through which the pin 34 stands. The size of the hole 36 is such that the pin 34 is kept off from the chassis 35. With this structure used, the main scanning electron microscope unit 5 is stopped by the chassis 35 from leaping further up and running up onto the bottom plate.

In the explanation on FIG. 5, the pin 34 is fixed to the flange 501 formed on the lower side of the sample chamber 2 and stand vertically to the flange 501. However the pin may be fixed horizontally on the side face of the sample chamber 2 and inserted in a hole in a plate member standing vertically on the bottom plate 12. In this structure the flange is not needed.

Third Embodiment

In the first embodiment an explanation is given on the structure of the desktop type scanning electron microscope which has a damper in direct contact with the floor surface. However there is problem with the main scanning electron microscope unit following the bottom plate if the damper is disposed simply on the apparatus installation plane. Therefore the following mechanism as is used for the second embodiment is needed. The present embodiment has a structure with which the damper is allowed to be made longer than the conventional structure while there is not such a problem with the following as for the first embodiment.

Firstly the vibration reduction structure of the present embodiment is to be explained. The internal structure of the electron optical column is the same as the first embodiment and its explanation is skipped.

Figure 6:
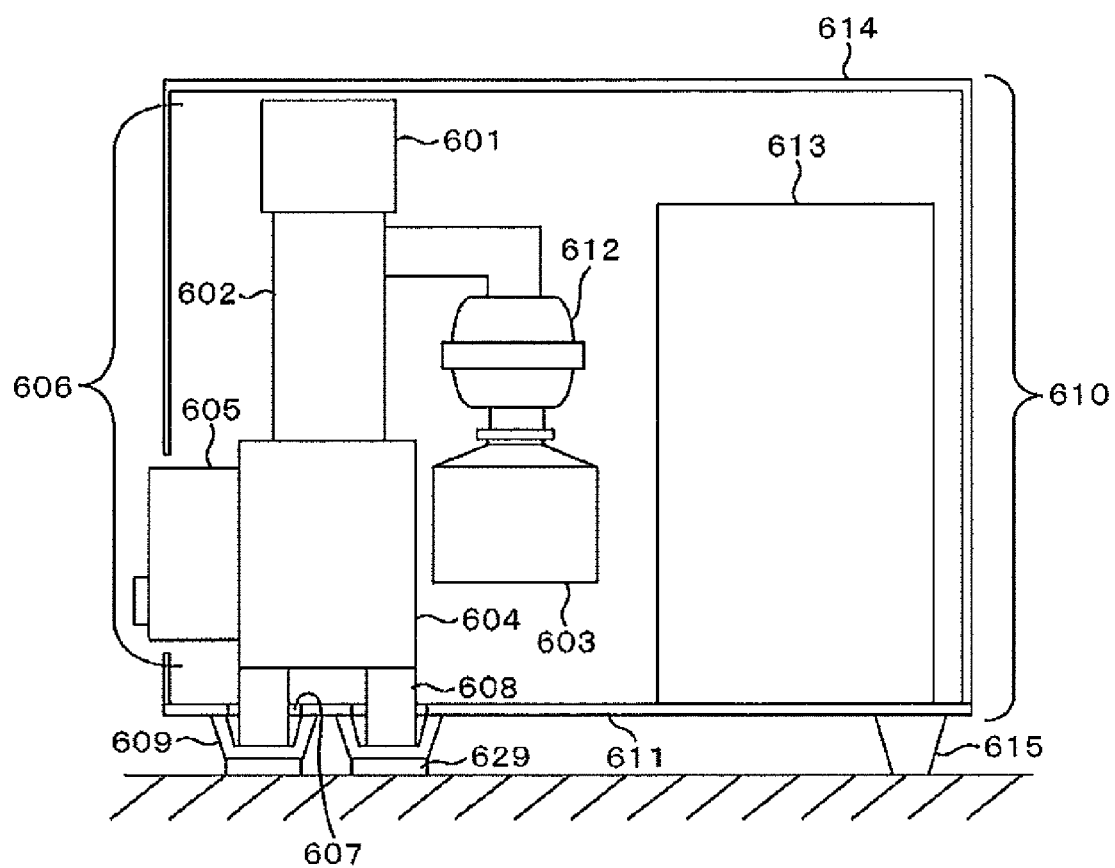
FIG. 6 shows a vibration reduction structure of a scanning electron microscope for the second embodiment.

FIG. 6 shows a cross section of the structure of a desktop type scanning electron microscope of the present embodiment. A main scanning electron microscope unit 606 inclusive of an electron beam gun 601, a lens unit 602, a main evacuation pump 603, a sample chamber 604 and a sample stage 605 is not fixed on a bottom plate 611 while only a control unit 613 and a housing 610 are fixed on the bottom plate 611, which is the same as the first embodiment. The main evacuation pump 603 to vacuum an inside of the main scanning electron microscope unit 606 is connected to an upper portion of the lens unit 602 through a buffer device 612 to reduce vibration. The control unit 613 includes a electron optical column (constituted by the electron beam gun 601 and the lens unit 602), a power supply and a control circuit board for the main evacuation pump 603, and a cooling fan. The main scanning electron microscope unit 606 and the control unit 613 which are mentioned above are housed together in a housing 614.

The scanning electron microscope 606 is supported by four vibration reduction buffers 608. Here there are at least four opening holes 607 bored through the bottom plate 611 and the four vibration reduction buffers 608 are disposed through the four opening holes 607. Moreover there is a second leg member 609 disposed under each of the four opening holes 607 and secured to the bottom plate with screws. A second leg member support 629 is attached on the bottom of the second leg member 609. The second leg member support 629 is made of a material that prevents a vibration from transmitting so that the main scanning electron microscope unit 606 is not easily affected by an external vibration.

A significant feature of the present embodiment is that the vibration reduction buffers 608 are not in direct contact with the floor surface and are fixed to the second leg members 609 that are attached on the back face of the bottom plate. Since an attachment surface of the vibration reduction buffer 608 onto the second leg member 609 comes below the bottom plate 611, the length of the vibration reduction buffer 608 is allowed to be made longer than that for the conventional apparatus in which the vibration reduction buffer 608 is disposed on an upper surface of the bottom plate 611. In the case of the present embodiment, since the vibration reduction buffer 608 is fixed on an inner wall surface of a recess formed on the second leg member 609, the vibration reduction buffer 608 is allowed to be made longer than that fixed on an upper surface of the second leg member 609 that has no recess. Furthermore, since the second leg member 609 is fixed to the bottom plate 611 and the vibration reduction buffer 608 is fixed to the second leg member 609, there is no problem with the following.

Although the second leg member 609 is a separate member from the bottom plate 611 and fixed to the bottom plate 611 with screws, it should be obvious that the same effect as the present embodiment is created if the second leg member 609 and a bottom plate 611 are integrally produced by press-molding the bottom plate into the second leg member 609 that is integrally formed with the bottom plate 611. However the second leg member 609 is preferably a separate member from the bottom plate 611, because an effect of internal vibration is reduced if the main scanning electron microscope unit 606 is separable from the housing 10 though not completely separate from the housing 10 that is a vibration source.

As is the case with the first embodiment, the internal vibration is dispersed and transmitted to the installation surface in this embodiment. That is, the internal vibration generated in the cooling fan or the like is necessarily transmitted to the second leg members 609 through the bottom plate 611 and a part of the internal vibration is transmitted to the floor surface through the second leg member supports. The remainder is transmitted to and dampens at the vibration reduction buffers 608, and further transmitted to the main scanning electron microscope unit 606 inclusive of the electron beam gun 601, the lens unit 602, the main pump 603, the sample chamber 604 and the sample stage 605.

On the other hand, in the case of the structure of the conventional desktop type scanning electron microscope shown in FIG. 3, the dampers 313 on which the main scanning electron microscope unit 303 is mounted are fixed onto the bottom plate 312. Accordingly, the internal vibration generated at the cooling fan is transmitted to the main scanning electron microscope unit 303 through the bottom plate 312 and the dampers 313 and the main scanning electron microscope unit 303 is more affected by the vibration generated inside the apparatus, compared with the structure of the present embodiment. Therefore, the structure of the present embodiment is capable of reducing the effect from the vibration generated inside the apparatus.

Moreover, the present embodiment allows the lower surface of the main scanning electron microscope unit 606 that is fixed onto the upper surface of the vibration reduction buffers 608 to be disposed lower than if the main scanning electron microscope unit 606 is mounted on the bottom plate 611. Accordingly a gravitational center of the apparatus of the present embodiment is made lower than that of the conventional apparatus. If there is no difference of the height of the main scanning electron microscope unit 606 from the conventional apparatus, the height of the housing 614 is made shorter than the conventional apparatus by the height difference in the lower surface of the main scanning electron microscope unit 606 fixed onto the upper surface of the vibration reduction buffers 608.

Figure 7:
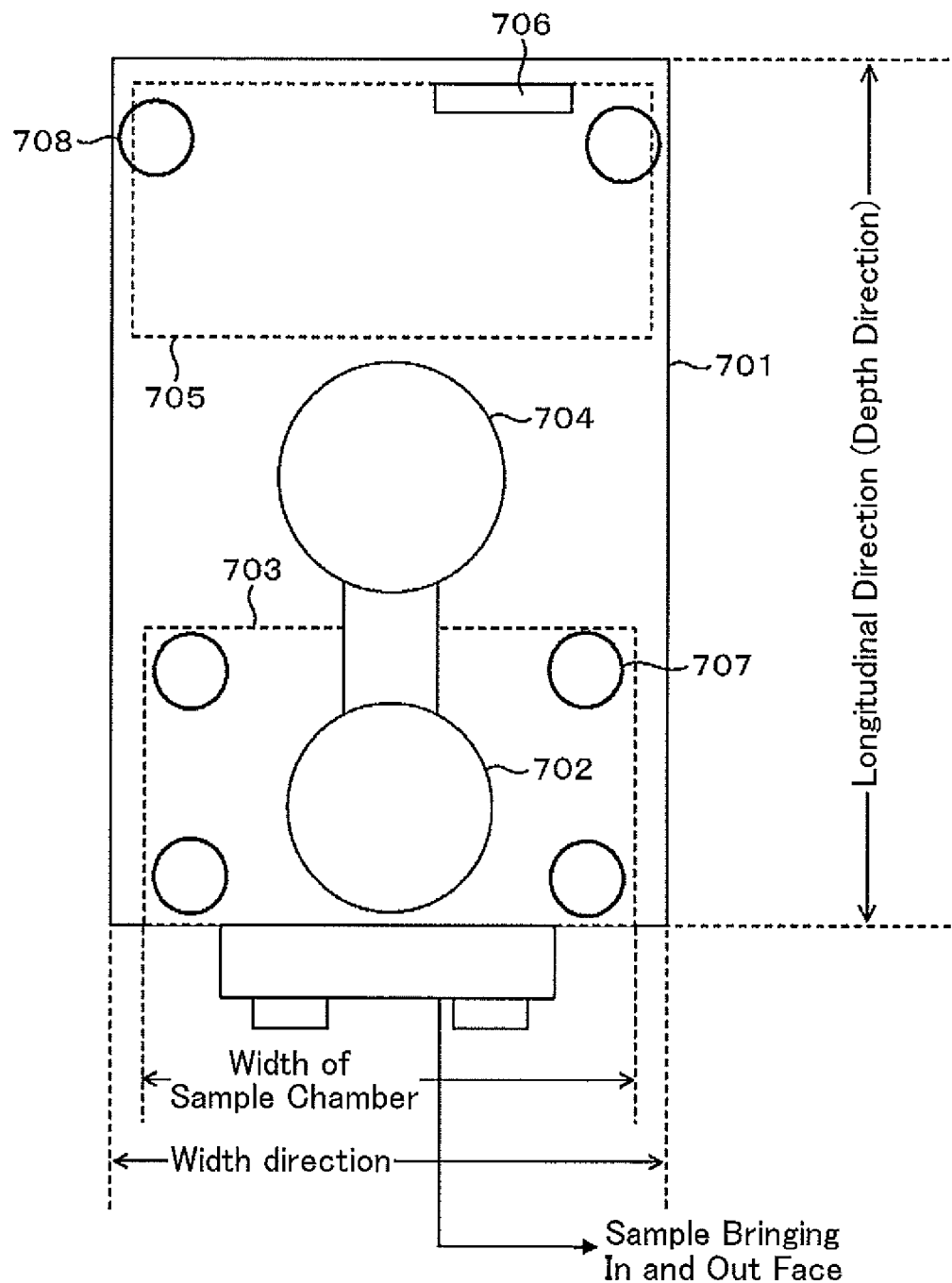
FIG. 7 shows a plan view for a scanning electron microscope for the second embodiment.
Figure 8:
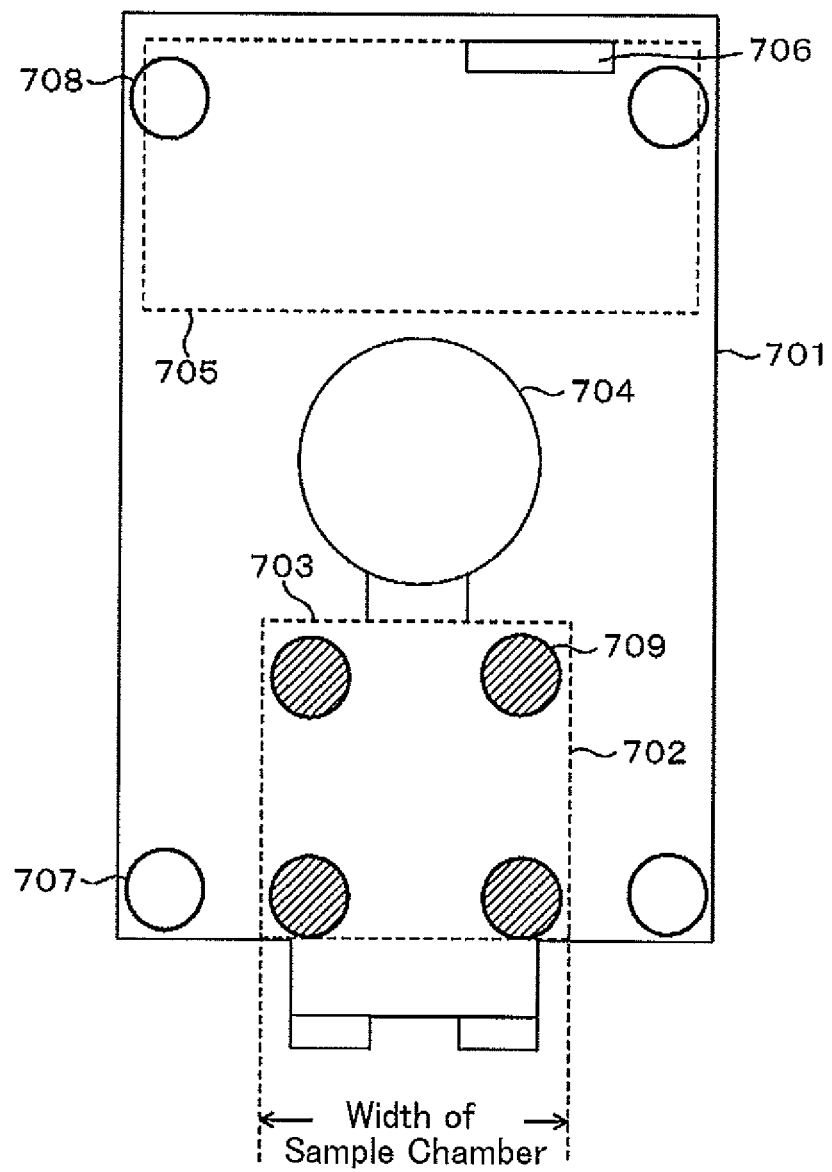
FIG. 8 shows a layout of a scanning electron microscope in which a leg member does not function as a damper.

Another significant feature of the scanning electron microscope having a vibration reduction structure of the present embodiment is that support points of the vibration reduction buffers supporting the main scanning electron microscope unit are identical with support points of leg members supporting the bottom plate. FIG. 7 and FIG. 8 show plan views for lay-outs of the first leg members and the second leg members. FIG. 7 corresponds to a lay-out in which the support points of the vibration reduction buffers are identical with the support points of the leg members supporting the bottom plate, while FIG. 8 corresponds to a lay-out in which the support points of the vibration reduction buffers are not identical with the support points of the leg members supporting the bottom plate.

In FIG. 7, a rectangle indicated by a reference number 701 indicates the bottom plate 701, on which the electron optical column including the electron beam gun and the sample chamber. The housing, which is not shown, is fixed onto the bottom plate 701. A rectangle indicated by a dotted line indicates a projection face of the bottom face (more or less consisting of that of the sample chamber) of the main scanning electron microscope unit projected on the bottom plate 701. A sample bringing in and out face through which a sample is brought in and out of the sample chamber is disposed on the front side of the sample chamber (lower side on the figure). The electron optical column is disposed at the reference number 702. The control unit is disposed on the bottom plate 701 and opposite the main scanning electron microscope unit. A reference number 706 indicates a cooling fan. A rectangle 705 is a projection face of a control means projected on the bottom plate 701. The main evacuation pump is disposed more or less over a center of the bottom plate.

A pair of the first leg members 708 are disposed inside the projection face 705 of the control means and across the width of the bottom plate 701. Similarly a couple of pairs of the second leg members 707 are disposed inside a projection face 703 of the main scanning electron microscope unit.

In a case sown in FIG. 8, first leg members 708 and second leg members 707 are disposed at four corner portions of the bottom plate 701 and vibration reduction buffers, which are support members to absorb vibration and to be necessarily disposed on a lower portion of the main scanning electron microscope unit, interfere with leg members, because the vibration reduction buffers extend down through the bottom plate to the installation surface in the structure of the present invention. As a result, the width of the sample chamber is restricted and can not be made longer as shown in FIG. 8.

On the other hand, in the case of the present embodiment, each of the vibration reduction buffers 608 is fixed on an axis on which a second leg member 609 as is indicated in FIG. 6. That is, a position of the vibration reduction buffer 608 at which a load is applied is identical within the installation plane of a scanning electron microscope with a position of the second leg member 609 at which the load is applied. Looking at FIG. 7, each of the vibration reduction buffers 608 is disposed at a position of a second leg member 707 and does not interfere with any of the leg members. Therefore the width of the sample chamber is allowed to be made as large as the whole width of the bottom plate.

Furthermore, since the main scanning electron microscope unit is heaviest among the units constituting the apparatus as exemplified in each of the embodiments 1 to 3, a gravitational center position of the whole apparatus on the bottom plate is on the side of the main scanning electron microscope unit from the center of bottom plate ((in FIG. 7)). As a result, there are more leg members on the side of the main scanning electron microscope unit than on the side of the control unit in each of the embodiments. As is shown in FIG. 7, there are a pair of the first leg members 708 disposed on the side of the control unit and a couple of pairs of the second leg members 707 on the side of the main scanning electron microscope unit. Accordingly loads applied to the leg members are more or less averaged.

REPRESENTATION OF SIGNS 1, 201, 301, 601 Electron Beam Gun
2, 202, 302, 604 Sample Chamber
3, 203, 303, 602 Lens System
4, 204, 304, 605 Sample Stage
5, 205, 305, 606 Main Scanning Electron Microscope Unit
9, 209, 309 Main Pump
12, 312, 611, 701 Bottom Plate
13, 14, 207, 211, 313, 314, 612 Damper
17 Electron Source
18 Electron Beam
19 Wehnelt Electrode
20 Anode
21 First Cross-over
22 First Condenser Lens
23 Second Condenser Lens
24 Second Cross-over
25 Objective Lens
26 Third Cross-over
27 Object Aperture
28 Sample Stage
29 Spring
30, 32, 34 Pin
31 Plate
33 Tension Force
35 Chassis
36 Hole bored through Chassis
106, 317, 616 Leg Member
107 Upper Face of Bottom Plate
108 Opening Hole
206 Load Plate
208 First Mount
210 Pipe
212 Monitor
213 Second Mount
214 Control Section
215 Computer
315, 613 Control Unit
316, 614 Cover
500, 609 Second Leg Member
501 Flange
603, 704 Main Evacuation Pump
607 Opening Hole
608 Vibration Reduction Buffer
610 Housing
615 First Leg Member
629 Second Leg Member Support
702 Position of Electron Beam Gun
703 Projection Face of Main Scanning Electron Microscope Unit projected on Bottom Plate
705 Projection Face of Control Means projected on Bottom Plate
706 Position of Cooling Fan
707 a Pair of Second Leg Members
708, 709 a Pair of First Leg Members

What is claimed is:

1. A scanning electron microscope comprising,
a main scanning electron microscope unit including an electron optical column and a sample chamber,
a control means over the main scanning electron microscope unit,
a single housing that houses both the main scanning electron microscope unit and the control means,
a bottom plate disposed under the single housing, the main scanning electron microscope unit and the control means,
a first leg member attached to a bottom face of the bottom plate on a side of the control means,
a first opening hole through the bottom plate on a side of the main scanning electron microscope unit, and
a damper fixed to a bottom face of the main scanning electron microscope unit and disposed through the first opening hole.

2. The scanning electron microscope as described in claim 1, wherein the damper is disposed in a direct contact with an installation plane.

3. The scanning electron microscope as described in claim 1, further comprising a second leg member disposed under the first opening hole, on an inner face of which the damper fixed.

4. The scanning electron microscope as described in claim 1, further comprising a following mechanism with which to have the main scanning electron microscope unit follow the bottom plate moving or the single housing moving.

5. The scanning electron microscope as described in claim 4, wherein the following mechanism comprises
a plate member that is fixed to the damper and disposed on a side of an installation plane from the bottom plate and apart from the bottom plate,
a spring connecting the plate member with the bottom plate, and
fixing means to fix the spring with a bottom face of the bottom plate and an upper face of the plate member.

6. The scanning electron microscope as described in claim 1, further comprising a chassis having a second opening hole, the chaises disposed above an upper surface of the bottom plate and a pin that is fixed to the sample chamber and inserted into the second opening hole.

7. A scanning electron microscope comprising, a main scanning electron microscope unit including an electron optical column and a sample chamber, a control means over the main scanning electron microscope unit, a single housing that houses both the main scanning electron microscope unit and the control means, a bottom plate disposed under the single housing, the main scanning electron microscope unit and the control means, a first leg member attached to a bottom face of the bottom plate on a side of the control means, a second leg member attached to a bottom face of the bottom plate on a side of the main scanning electron microscope unit and a damper fixed to a bottom face of the main scanning electron microscope unit and disposed coaxially with the second leg member.

8. The scanning electron microscope as described in claim 7, wherein the damper is disposed through the first opening hole and fixed to an inner wall face of the second leg member.

9. The scanning electron microscope as described in claim 7, wherein the second leg member is a separate member from the bottom plate.

10. The scanning electron microscope as described in claim 7, wherein the second leg member is integrally molded with the bottom plate.

11. The scanning electron microscope as described in claim 7, further comprising a second leg member support attached onto a bottom face of the second leg member.

12. The scanning electron microscope as described in claim 7, wherein at least four of the dampers are attached on the bottom face of the main scanning electron microscope unit and at least a couple of the first leg members are attached on a bottom face of the bottom plate on a side of the control means.

13. A scanning electron microscope comprising, a main scanning electron microscope unit including an electron optical column and a sample chamber, a control means over the main scanning electron microscope unit, a single housing that houses both the main scanning electron microscope unit and the control means, a bottom plate disposed under the main scanning electron microscope unit and the control means, a plurality of first leg members attached on a bottom face of the bottom plate under the control means, a plurality of second leg members attached on a bottom face of the bottom plate under the main scanning electron microscope unit, a plurality of thru holes through the bottom plate under the main scanning electron microscope unit, the plurality of thru holes being aligned with the plurality of the second leg members, and a plurality of dampers each of which has one end fixed on a bottom face of the main scanning electron microscope unit and the other end fixed on an inner wall face of one of the plurality of second leg members, and is disposed through one of the plurality of thru holes, wherein there are more of the second leg members than the first leg members.

14. The scanning electron microscope as described in claim 13, wherein the second leg member is made of a different material from the bottom plate.

* * * * *